United States Patent
Nies

(10) Patent No.: US 7,930,821 B2
(45) Date of Patent: Apr. 26, 2011

(54) COMPONENT PLACEMENT DEVICE AS WELL AS A METHOD FOR TRANSPORTING SUBSTRATES THROUGH SUCH A COMPONENT PLACEMENT DEVICE

(75) Inventor: Alexander Antonius Franciscus Nies, Geldrop (NL)

(73) Assignee: Assembleon N.V., Veldhoven (NL)

( * ) Notice: Subject to any disclaimer, the term of this patent is extended or adjusted under 35 U.S.C. 154(b) by 0 days.

(21) Appl. No.: 12/685,922

(22) Filed: Jan. 12, 2010

(65) Prior Publication Data

US 2010/0107410 A1    May 6, 2010

Related U.S. Application Data

(62) Division of application No. 12/000,794, filed on Dec. 17, 2007, now Pat. No. 7,676,907.

(30) Foreign Application Priority Data

Dec. 20, 2006 (NL) ...................................... 1033099

(51) Int. Cl.
    *H05K 3/30* (2006.01)
(52) U.S. Cl. ................ 29/832; 29/739; 29/740; 29/742; 29/743; 414/222.1
(58) Field of Classification Search ..................... 29/739, 29/740, 742, 743; 414/222.11
    See application file for complete search history.

(56) References Cited

U.S. PATENT DOCUMENTS

| 6,079,096 A | 6/2000 | Hata et al. |
| 7,552,529 B2 | 6/2009 | Konrath et al. |

FOREIGN PATENT DOCUMENTS

| EP | 0 413 098 A2 | 2/1991 |
| WO | WO 96/18286 A | 6/1996 |
| WO | WO 02/47454 A | 6/2002 |

*Primary Examiner* — A. Dexter Tugbang
*Assistant Examiner* — Azm Parvez
(74) *Attorney, Agent, or Firm* — Foley & Lardner LLP

(57) ABSTRACT

A component placement device suitable for placing a component on a substrate comprises at least one component feeder, at least one substrate conveyor as well as at least one component pickup and placement device for picking up a component from the component feeder and placing said component on a substrate supported by the substrate conveyor. The substrate conveyor comprises a substrate feeding portion comprising at least two substrate feed tracks extending parallel to each other, a substrate processing portion located near the component feeder, which is connected to the substrate feeding portion and which comprises a single substrate processing track, a substrate discharging portion connected to the substrate processing portion, which comprises at least two substrate discharge tracks extending parallel to each other, as well as transfer means for transferring substrates from a second substrate feed track to a first substrate feed track and from a first substrate discharge track to a second substrate discharge track.

1 Claim, 5 Drawing Sheets

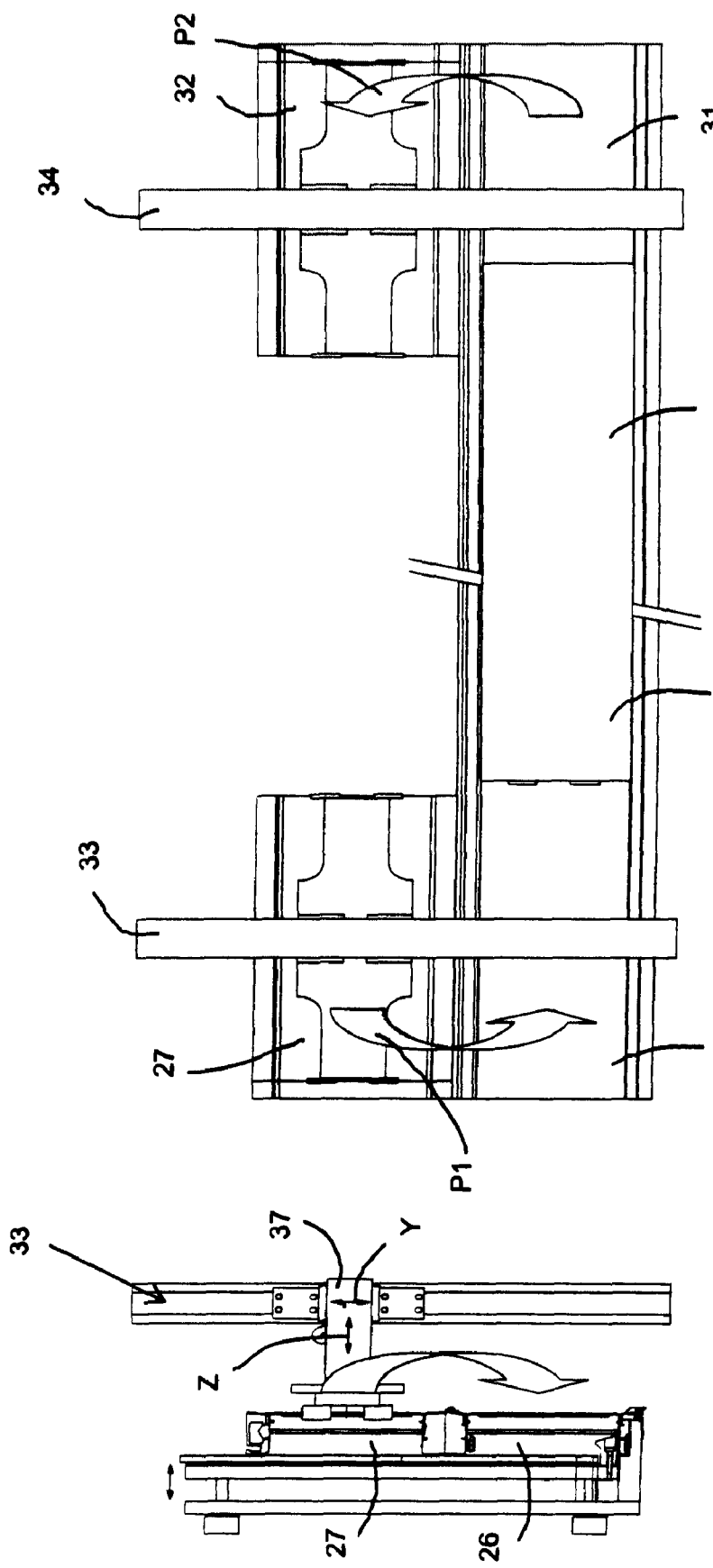

COMPONENT PLACEMENT DEVICE AS WELL AS A METHOD FOR TRANSPORTING SUBSTRATES THROUGH SUCH A COMPONENT PLACEMENT DEVICE

The invention relates to a component placement device suitable for placing a component on a substrate, which component placement device comprises at least one component feeder, at least one substrate conveyor as well as at least one component pickup and placement device for picking up a component from the component feeder and placing said component on a substrate supported by the substrate conveyor.

The invention also relates to a method for transporting substrates through such a component placement device.

In such a component placement device, which is known from WO-A1-02/47454, substrates are transported parallel to each other in the X-direction, whilst component are supplied in a Y-direction perpendicular thereto from component feeders extending parallel to the direction of transport. The substrates may be printed circuit boards, for example. Each substrate may also comprise a holder which supports a number of substrates.

By transporting substrates parallel to each other in the X-direction, the amount of space required for moving the substrates can be comparatively limited. A drawback of the known component placement device, however, is the fact that the time required for placing components on the substrates is comparatively long, since the distance from the component feeder to the substrate to be covered by the components is comparatively long.

The object of the invention is to provide a device by means of which substrates can be transported in an efficient manner, whilst components can be placed on the substrates comparatively quickly.

This object is accomplished with the component placement device according to the invention in that the substrate conveyor comprises a substrate feeding portion comprising at least two substrate feed tracks extending parallel to each other, a substrate processing portion located near the component feeder, which is connected to the substrate feeding portion and which comprises a single substrate processing track, a substrate discharging portion connected to the substrate processing portion, which comprises at least two substrate discharge tracks extending parallel to each other, as well as transfer means for transferring substrates from a second substrate feed track to a first substrate feed track and from a first substrate discharge track to a second substrate discharge track.

Since only a single substrate processing track is located near the component feeder, the distance between the component feeder and the substrate present on the substrate processing track is comparatively short. As a result, the time required for placing a component is likewise comparatively short. Since the substrate conveyor comprises at least two substrate feed tracks and at least two substrate discharge tracks on either side of the component feeder, the amount of space required for supplying and discharging the substrates is relatively limited. The transfer means simply place the substrates from the second substrate feed track on the first substrate feed track, so that all substrates can be placed on said single substrate processing track near the component feeder. Once the components have been placed on the substrate supported by the substrate processing track, the transfer element will transfer some of the substrates from the first substrate discharge track connected to the substrate processing track to the second substrate discharge track.

It is noted that from EP-A2-0 413 098 a method is known wherein a single conveying system is temporarily configured as a double-track conveying system at the location of a comparatively time-consuming process station, whilst downstream of said process station it is configured as a single-track conveying system again. In the present invention the conveying rate of the substrate feeding portion and the substrate discharging portion can be easily adapted to the conveying rate of the substrate processing portion. In practice the conveying rate of the substrate feeding portion and/or the substrate discharging portion may even be higher than at the substrate processing portion, also if the substrate feeding portion and/or the substrate discharging portion should be of the single-track type. By providing the substrate feeding portion and the substrate discharging portion with at least two substrate feed tracks extending parallel to each other, the amount space required for conveying the substrates can be kept within bounds.

One embodiment of the component placement device according to the invention is characterised in that the first substrate feed track, the substrate processing track and the first substrate discharge track are arranged in line with each other.

In this way substrates can be transported from the first substrate feed track to the first substrate processing track and from the substrate processing track to the first substrate discharge track in a simple manner.

The invention also relates to a method for transporting substrates through a component placement device according to the invention. The method is characterized in that substrates are transferred to the substrate processing track alternately from the first substrate feed track and the second substrate free track, after which substrates are alternately transferred to the first substrate discharge track and the second substrate discharge track.

As a result, the substrate feed tracks and the substrate discharge tracks are efficiently utilized.

The invention will now be explained in more detail with reference to the drawings, in which:

FIG. 4A is a top plan view of a substrate conveyor of the component placement device according to the invention;

FIG. 4B is a side view of the substrate feeder shown in FIG. 3A.

Like parts are indicated by the same numerals in the figures.

Figure 1:
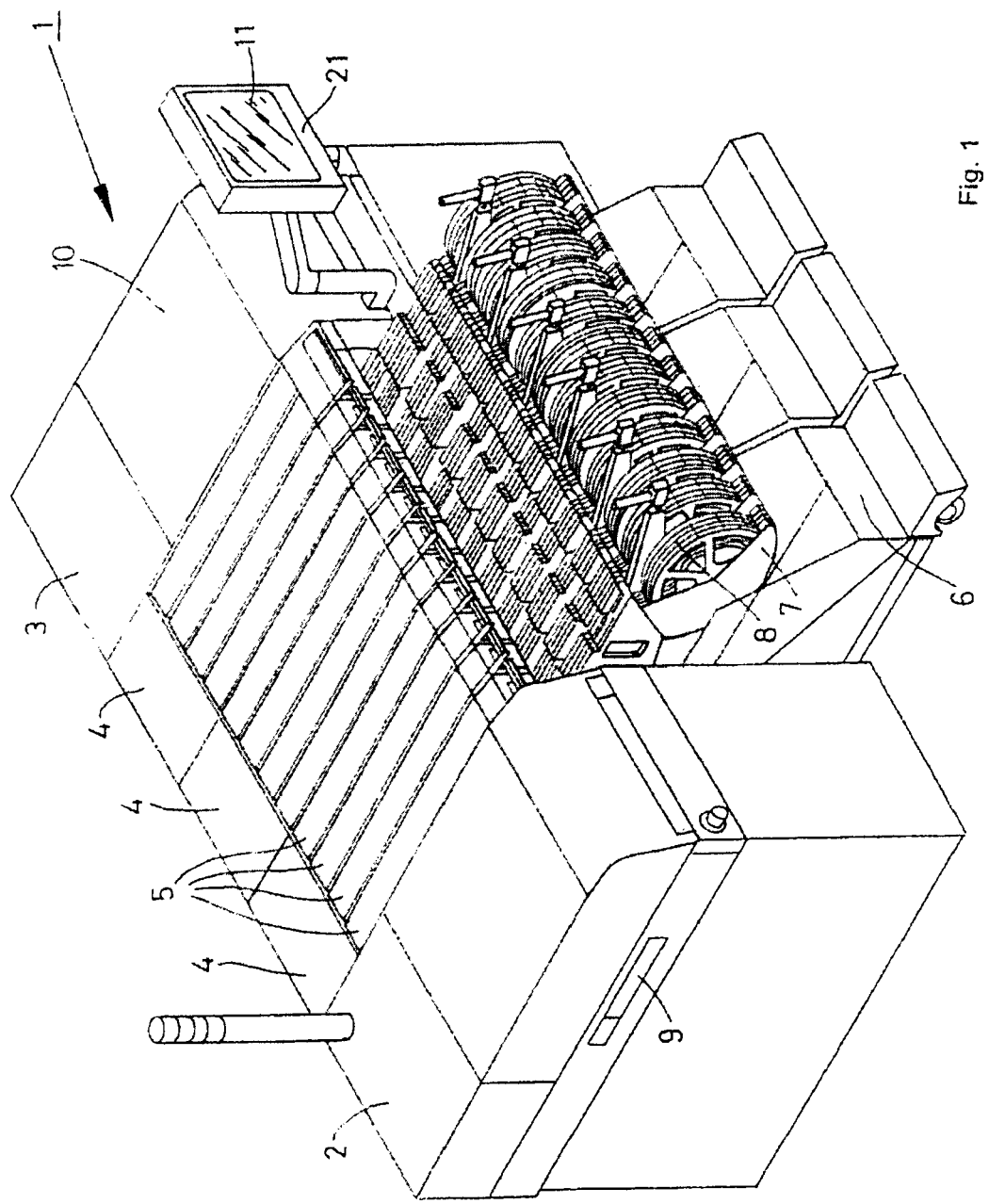
FIG. 1 is a perspective view of a component placement device according to the invention.
Figure 3A:
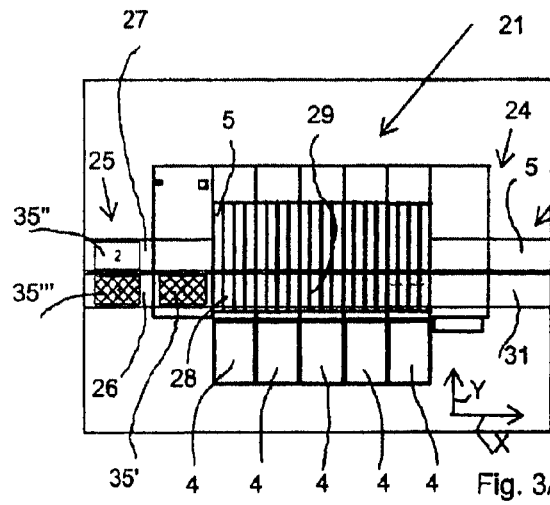
FIGS. 3A-3J are top plan views of a component placement device according to the invention during various processing steps.
Figure 3B:
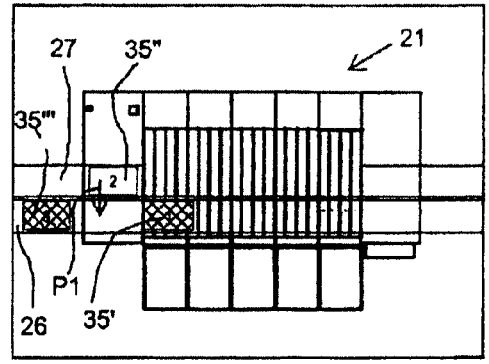

FIG. 1 shows a component placement device 1 as known per se, which is suitable for use in combination with the substrate conveyor shown in FIGS. 3A-4 so as to provide a component placement device according to the invention. The component placement device 1 comprises a substrate feeding portion 2, a substrate discharging portion 3 and three modules 4, each comprising four component pickup and placement units 5. The component placement device 1 further comprises three trolleys 6, each comprising four component feeders 7, each component feeder 7 being provided with six reels 8. Each reel 8 has a tape wound thereon, in which tape components are present.

The substrate feeding portion 2 is provided with a substrate inlet 9, via which substrates 17 can be supplied to the component placement device 1. The substrate discharging portion 3 is provided with a substrate outlet 10, via which the substrates 10 provided with components 29 can be discharged from the component placement device 1.

The component placement device 1 further comprises a control unit 11.

The number of modules 4 and the corresponding number of trolleys 6 can be determined as desired by a user at the time of the purchase of the component placement device 1.

Figure 2:
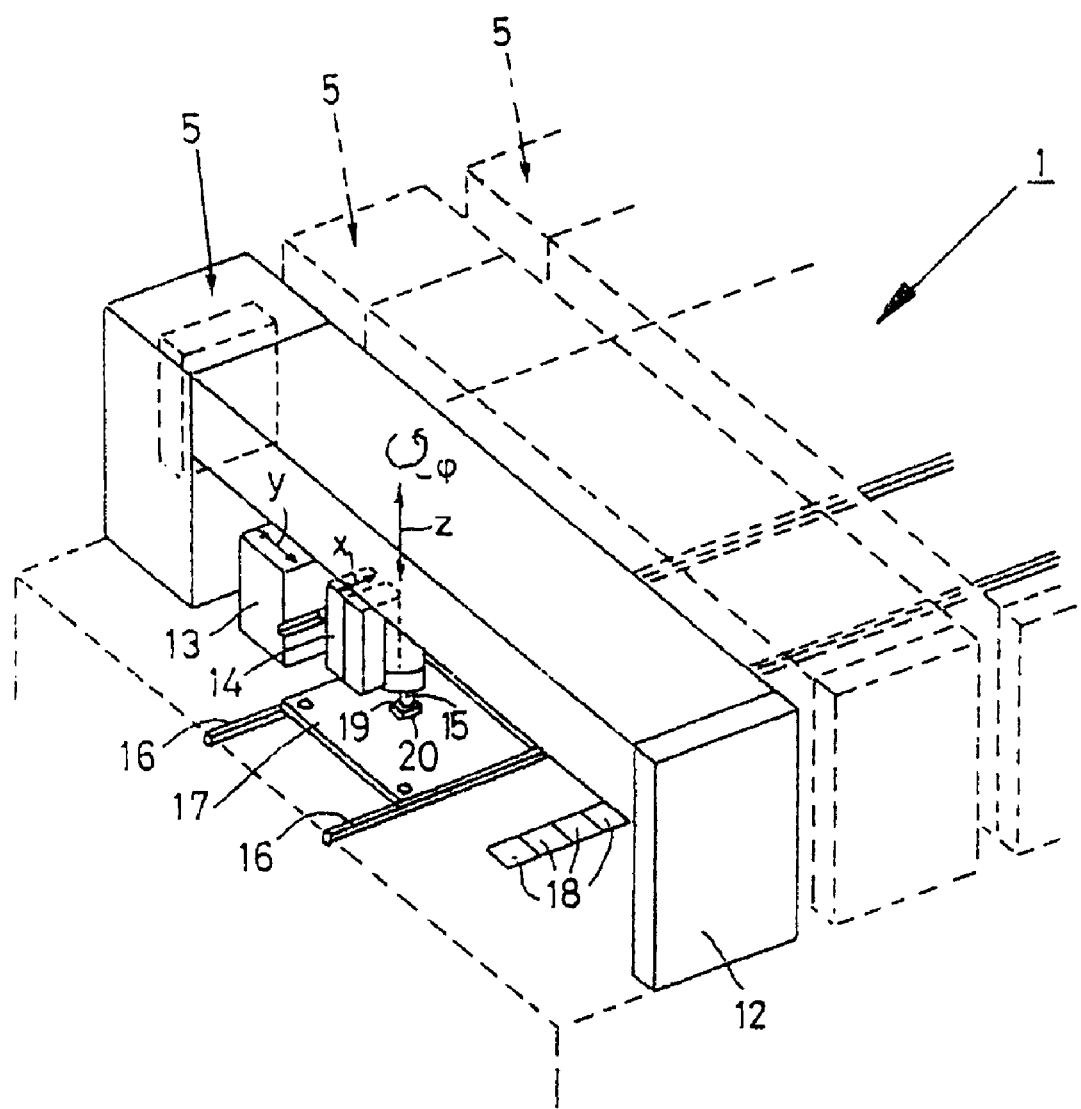
FIG. 2 is a schematic perspective view of a part of the component placement device shown in FIG. 1.

FIG. 2 is a perspective view of a part of the component placement device 1 shown in FIG. 1, which clearly shows the structure of a separate component pickup and placement unit 5.

The component pickup and placement unit 5 comprises an elongate U-shaped frame 12, a first slide 13, which is movable in the directions indicated by the double arrow Y with respect to the frame 12, and a second slide 14, which is movable in the directions indicated by the double arrow X with respect to the slide 13, as well as a vacuum tube 15, which is movable in the directions indicated by the double arrow Z with respect to the second slide 14.

The component placement device 1 further comprises a substrate processing portion comprising two parallel rails 16, by means of which a substrate 17 to be provided with components 19 is supported, The substrate 17 can be moved in steps at a certain transport velocity over the rails 16 from the substrate inlet 9 to the substrate outlet 10.

Each component pickup and placement unit 5 has a number of component pickup positions 18, which number corresponds to the number of reels 8 associated with the component pickup and placement unit 5, which are present in the reel holder 7.

The component placement device is controlled from the control unit 11 in such a manner that a desired component 19 is picked up from a component pickup position 18 by means of each component pickup and placement unit 5, after which the component 19 picked up by means of the vacuum tube 15 is moved to a component placement position 20 on the substrate 17 and placed on the substrate at that location. The component placement device 1 described so far and also the operation thereof are known per se and will not be explained in more detail, therefore.

FIGS. 3A-3J are top plan views of various processing steps of a component placement device 21 according to the invention. The component placement device 21 comprises five modules 4 extending parallel to each other, which are each provided with four component pickup and placement units 5. The component feeders 7 are situated on one side of the component placement device 21. The component placement device 21 further comprises a substrate conveyor 24, which comprises a substrate feeding portion 25 comprising two substrate feed tracks 26, 27 extending parallel to each other. The substrate conveyor 24 further comprises a substrate processing portion 28 comprising a single substrate processing track 28, which is connected to a first substrate feed track 26. The substrate conveyor 24 further comprises a substrate discharging portion 30 comprising two substrate discharge tracks 31, 32 extending parallel to each other, of which the first substrate discharge track 31 is connected to the substrate processing track 29. The first substrate feed track 26, the substrate processing track 29 and the first substrate discharge track 31 are arranged in line with each other. As is shown more clearly in FIG. 3A and FIG. 4, the substrate conveyor 24 is provided with transfer elements 33, 34, by means of which substrates 35 can be transferred from the second substrate feed track 27 to the first substrate feed track 26 and from the first substrate discharge track 31 to the second substrate discharge track 32.

Such transfer elements 33, 34 may be configured in various ways, for example comprising suction cups, grippers, movable or slidable supports, etc.

Figure 3C:
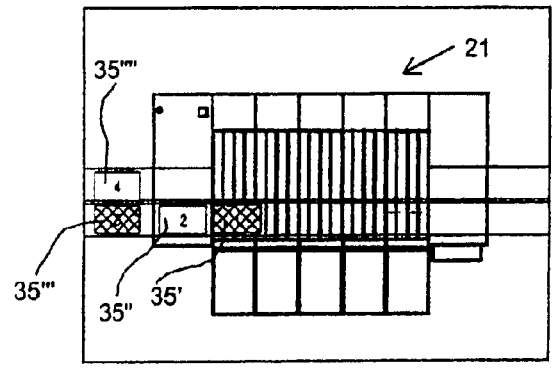

The method of operation of the component placement device 21 according to the invention is as follows. Using the substrate feeding portion 25, substrates 35 are moved in the X-direction to the component pickup and placement devices 32 both over the first substrate feed track 26 and over the second substrate feed track 27. The substrates 35 are indicated with apostrophes for the sake of clarity so as to be able to distinguish between the various substrates in a simple manner. Substrates indicated by an uneven number of apostrophes are present on the first substrate feed track 26 and substrates indicated by an even number of apostrophes are present on the second substrate feed track 27. The substrates 35 are moved in an X-direction to the position shown in FIG. 3A. The substrate 35''' is then stopped, whilst the substrates 35' and 35'' are transported further in the X-direction over the first substrate feed track 26 and the second substrate feed track 27, respectively, to the positions shown in FIG. 3B. The substrate 35'' is then transferred from the second substrate feed track 27 to the first substrate feed track 26, in the direction indicated by the arrow P1, by means of the transfer element 33. The substrate 35'' is thereby positioned between the substrate 35' and the substrate 35'''. This situation is shown in FIG. 3C, In the meantime, a next substrate 35'''' has been moved in the X-direction over the second substrate feed track 27. Subsequently, all substrates 35', 35'', 35''' and 35'''' are moved in the X-direction (FIG. 3D).

Once a substrate is present in the substrate processing portion 29, components are picked up from the component feeders and placed on the substrates 35 by means of the component pickup and placement devices 5. Each component pickup and placement device 5 has specific component feeders 7 associated therewith, which component feeders supply specific components. After a substrate has passed all the component pickup and placement devices 5, all the desired components have been placed on the substrate 35.

Figure 3D:
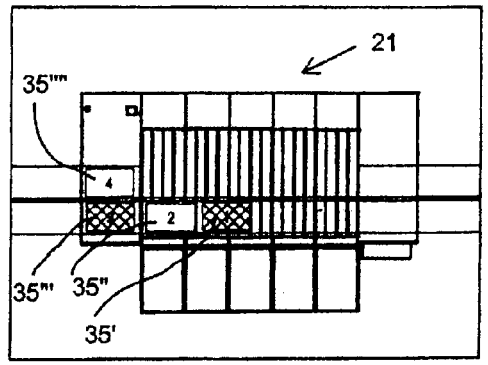
Figure 3E:
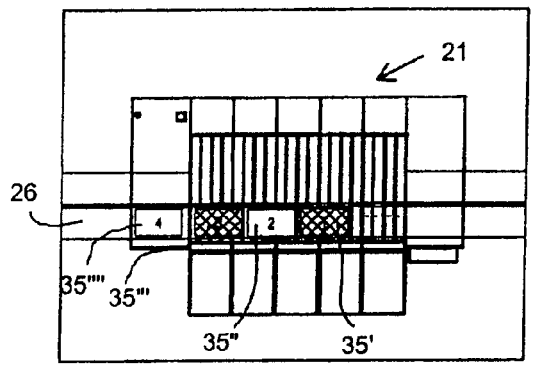
Figure 3F:
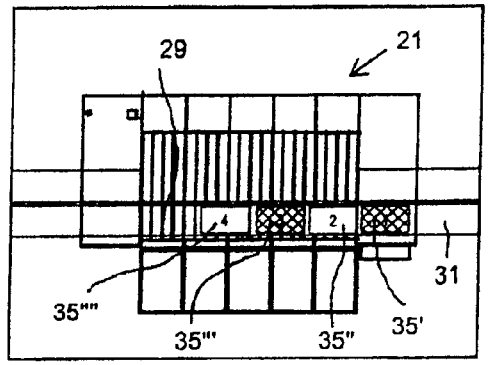
Figure 3G:
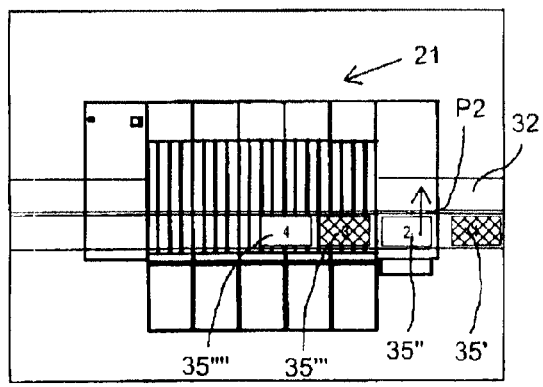
Figure 3H:
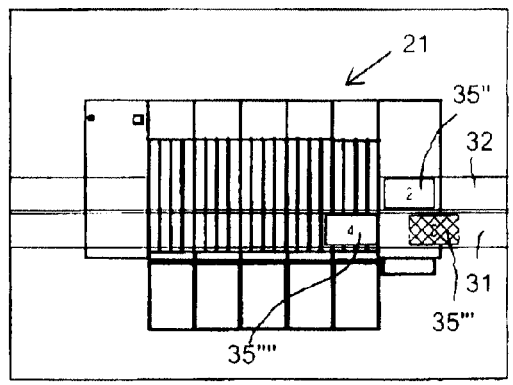
Figure 3I:
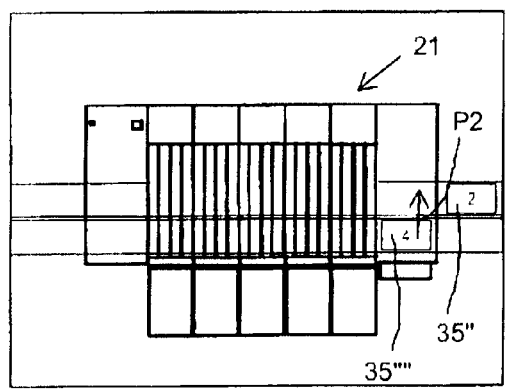
Figure 3J:
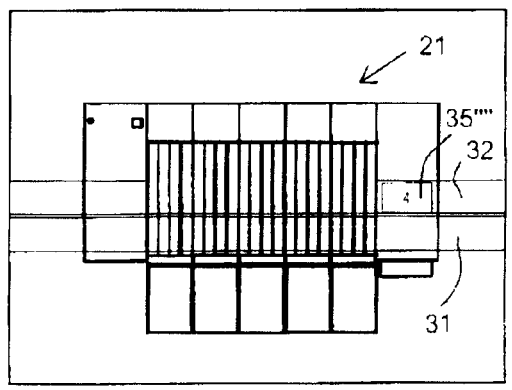

In the situation shown in FIG. 3D, a next substrate 35 with number 5 is stopped, so that the substrate 35'''' can be positioned between the substrate 35' and the next substrate (not shown) on the first substrate feed track 26 (FIG. 3E). The substrates 35 are then moved in the X-direction over the single substrate processing track 29, as shown in FIG. 3F, and components are placed on the substrates 35. After the substrate 35' has passed all the component pickup and placement devices 5, the substrate 35' comes to be positioned on the first substrate discharge track 31. By moving the substrates 35 further in the X-direction, the next substrate 35'' also comes to be positioned on the substrate discharge track 31. The substrate 35'' is moved in the direction indicated by the double arrow P2 and transferred to the second substrate discharge track 32 (FIG. 3G). The substrate 35''' is passed on from the substrate processing track 29 to the first substrate discharge track 31. Like the substrate 35'', the substrate'''' is transferred from the first substrate discharge track 31 to the second substrate discharge track 32 by the transfer means 34, as is shown in FIGS. 3J and 3K.

If components can be placed on the substrate 35 relatively quickly by means of the component pickup and placement devices 5, the velocity at which substrates 35 are moved in the X-direction by means of the substrate processing track may be significantly higher than the velocity at which the substrates are moved over the substrate feed tracks 26, 27 and the substrate discharge tracks 31, 32. Since the distance between the component feeders 7 and the substrates 35 is comparatively short at the location of the substrate processing track 29, the time required for placing a component on a substrate 35 is likewise comparatively short, so that a high output of the component placement device 21 can be realised. The substrates 35 can be supplied and discharged in parallel at the same time, so that the amount of space required for supplying and discharging the substrates is comparatively limited. In addition, it is possible in this way to use the component placement device 21 in production lines in which two substrates lying side-by-side can be processed simultaneously by means of processing machines disposed upstream and downstream of the component placement device 21.

FIGS. 4A and 4B are a plan view and a side view, respectively, of the substrate conveyor 24, in which the transfer elements 33, 34 are clearly shown. Each transfer element 33, 34 is provided with a gripper 37 being movable in Y- and Z-directions, by means of which the substrates 35 can be moved in the directions indicated by the arrows P1, P2 from the second substrate feed track 27 to the first substrate feed track 26 and from the first substrate discharge track 31 to the second substrate discharge track 32, respectively.

The invention claimed is:

1. A method for transporting substrates through a component placement device suitable for placing a component on a substrate, which component placement device comprises at least one component feeder, at least one substrate conveyor as well as at least one component pickup and placement device for picking up a component from the component feeder and placing said component on a substrate supported by the substrate conveyor, wherein in that the substrate conveyor comprises a substrate feeding portion comprising at least two substrate feed tracks extending parallel to each other, a substrate processing portion located near the component feeder, which is connected to the substrate feeding portion and which comprises a single substrate processing track, a substrate discharging portion connected to the substrate processing portion, which comprises at least two substrate discharge tracks extending parallel to each other, as well as a transfer element for transferring substrates from a second substrate feed track to a first substrate feed track and from a first substrate discharge track to a second substrate discharge track, the method comprising:
  transferring substrates to the substrate processing track alternately from the first substrate feed track and the second substrate feed track, after which transferring substrates alternately, to the first substrate discharge track and the second substrate discharge track.

* * * * *